(12) United States Patent
Kolsrud et al.

(10) Patent No.: US 7,064,613 B2
(45) Date of Patent: Jun. 20, 2006

(54) AMPLIFIER BIAS SYSTEM AND METHOD

(75) Inventors: Arild Kolsrud, Bridgewater, NJ (US);
Norman Gerard Ziesse, Chester, NJ (US)

(73) Assignee: Lucent Technologies Inc., Murray Hill, NJ (US)

( * ) Notice: Subject to any disclaimer, the term of this patent is extended or adjusted under 35 U.S.C. 154(b) by 0 days.

(21) Appl. No.: 10/105,834

(22) Filed: Mar. 25, 2002

(65) Prior Publication Data

US 2003/0179048 A1  Sep. 25, 2003

(51) Int. Cl.
*H03F 3/04*    (2006.01)

(52) U.S. Cl. ...................... 330/296; 330/302
(58) Field of Classification Search ........... 330/286, 330/296, 302
See application file for complete search history.

(56) References Cited

U.S. PATENT DOCUMENTS

| | | | | |
|---|---|---|---|---|
| 4,057,765 | A * | 11/1977 | Schuermann | 330/279 |
| 4,918,402 | A * | 4/1990 | Voorman et al. | 330/294 |
| 5,383,080 | A * | 1/1995 | Etoh et al. | 361/56 |
| 5,625,323 | A * | 4/1997 | Tozawa | 330/277 |
| 5,656,874 | A * | 8/1997 | Kato et al. | 307/111 |
| 6,218,904 | B1 * | 4/2001 | Panther | 330/296 |
| 6,346,859 | B1 * | 2/2002 | Saitou | 330/286 |
| 6,628,176 | B1 * | 9/2003 | Okada | 333/32 |

* cited by examiner

Primary Examiner—Henry Choe

(57) ABSTRACT

An amplifier bias system and method has only reduced resonances at least throughout the envelope frequency of the signal to be amplified. Thus, the amplifier bias system can provide bias current to the amplifier with minimal voltage variations over the envelope frequency band, especially during signal peaks. For example, the amplifier bias system can be used as an amplifier gate or drain bias network where the amplifier bias system is coupled between the power supply and the gate or drain terminals of the amplifier. The amplifier bias system can include an amplifier bias filter having an impedance which is relatively low at least throughout the envelope frequency of the input signal and relatively high at radio frequency. Because the amplifier bias filter has an impedance which is relatively low through at least the envelope or baseband frequency of the input signal and relatively high at radio frequency (RF), the voltage will be relatively constant due to the low voltage drops over the bias network from energy within the envelope frequency band. To reduce the propagation of frequency components within the envelope frequency through the amplifier bias system, an energy handling device can filter energy within the envelope frequency, for example by acting as a short to ground for certain frequencies within the envelope frequency. For signal peaks within the envelope frequency, the energy handling device can provide current through the amplifier bias filter to the amplifier.

7 Claims, 14 Drawing Sheets

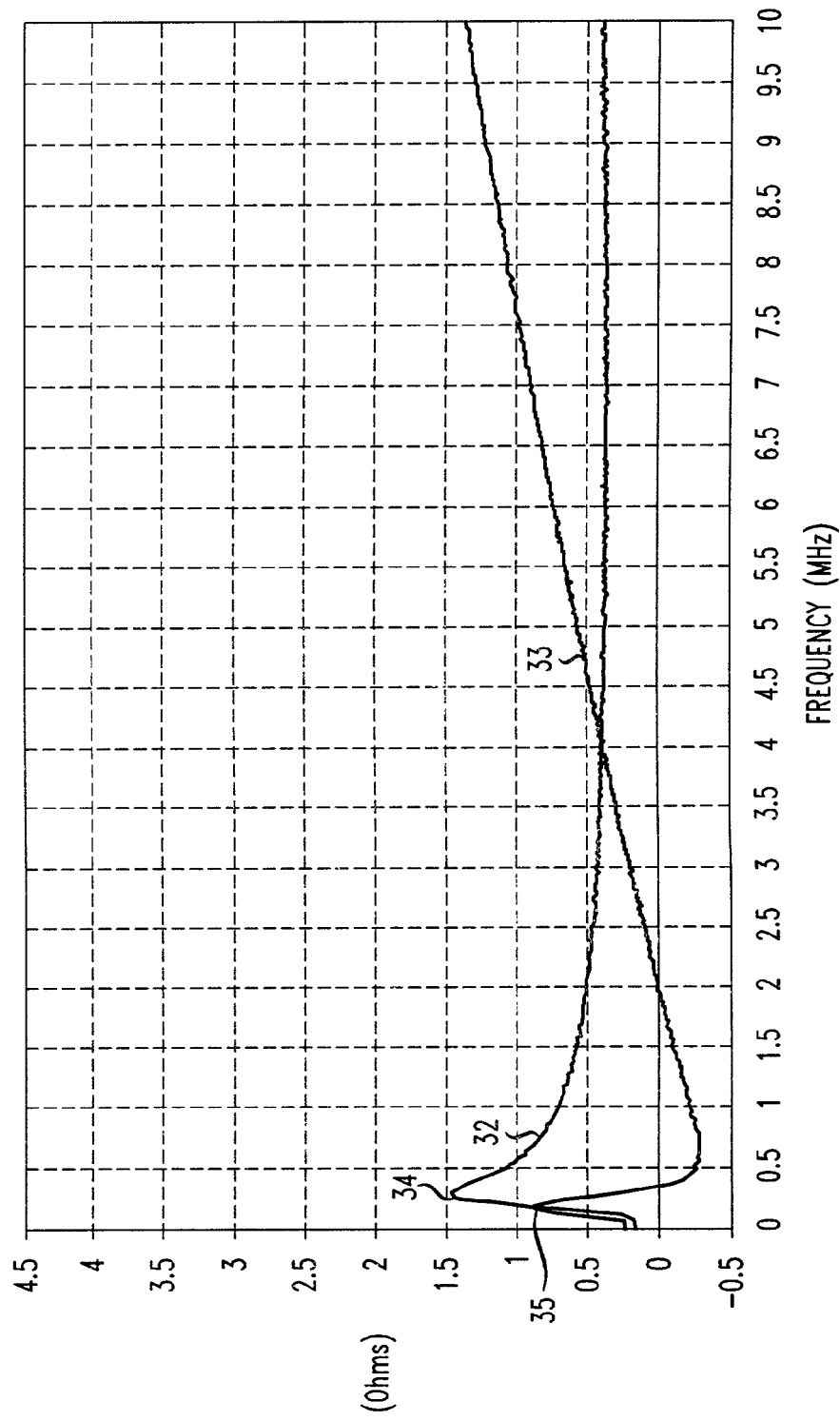

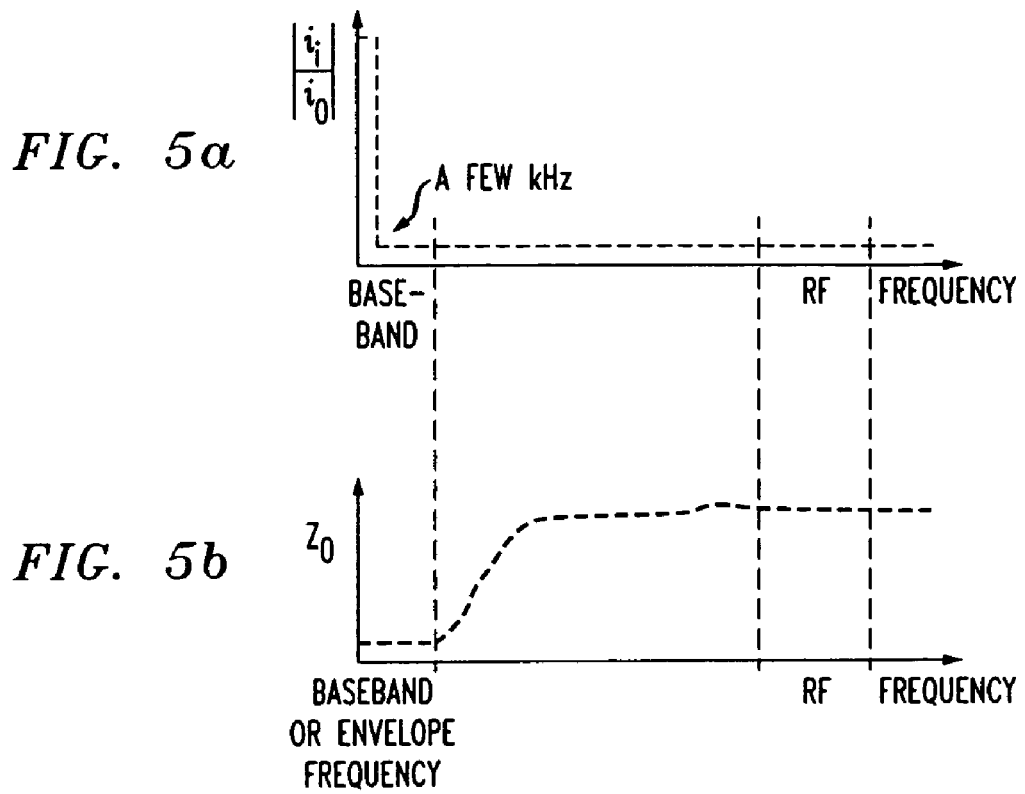
FIG. 5a
FIG. 5b
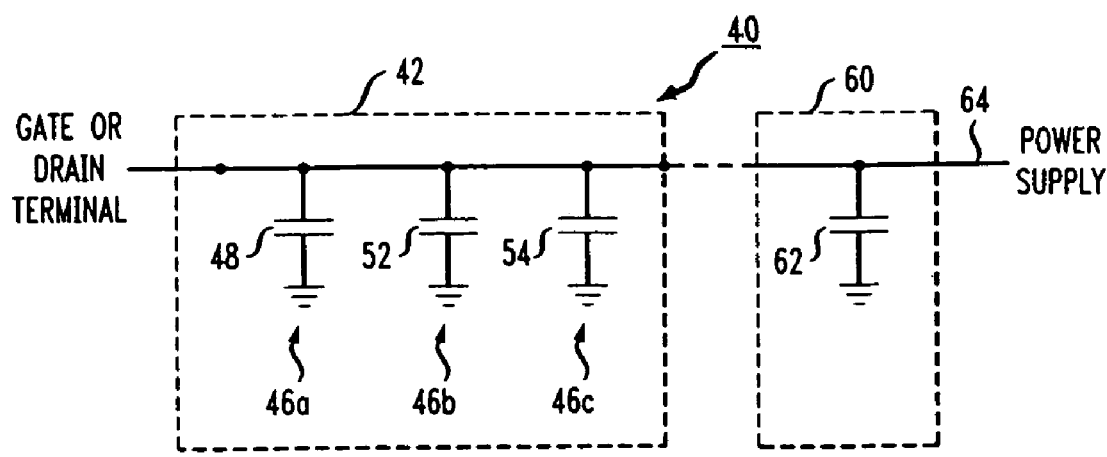
FIG. 6

120

AMPLIFIER BIAS SYSTEM AND METHOD

BACKGROUND OF THE INVENTION

1. Field of the Invention

This invention relates to communications, and, more particularly, to a system and method for a bias network of a power amplifier.

2. Description of Related Art

An ideal power amplifier amplifies an input signal with no waveshape alteration. The ideal power amplifier is therefore characterized as having a transfer function (input signal vs. output signal) which is linear with no transfer function discontinuities. In practice, however, a power amplifier has a transfer function with nonlinear and "linear" regions. Whether the power amplifier is operating in a linear or nonlinear region depends in part on the amplitude of the input signal. For the power amplifier to achieve as near to linear operation as possible, the power amplifier is designed to operate within its linear region given the range of possible input signal amplitudes. If the input signal has an amplitude which causes the power amplifier to operate outside the linear region, the power amplifier introduces nonlinear components or distortion to the signal. When the input signal possesses peak amplitudes which cause the amplifier to compress, to saturate (no appreciable increase in output amplitude with an increase in input amplitude) or to shut-off (no appreciable decrease in output amplitude with a decrease in input amplitude), the output signal is clipped or distorted in a nonlinear fashion. Generally, an amplifier is characterized as having a clipping threshold, and input signals having amplitudes beyond the clipping threshold are clipped at the amplifier output. In addition to distorting the signal, the clipping or nonlinear distortion of the input signal, generates spectral regrowth or adjacent channel power (ACP) that can interfere with an adjacent frequency.

In wireless communications systems, high power amplification of signals for transmission are commonly encountered with very large peak to average power ratios (PAR). For example, in a time division multiple access (TDMA) system, such as Global System for Mobile Communications (GSM) or North American TDMA, when multiple carrier signals are combined for amplification with a power amplifier, the resulting PAR is about 9–10 dB for a large number of carriers. In a code division multiple access (CDMA) system, a single loaded 1.25 Mhz wide carrier can typically have a PAR of 11.3 dB. For orthogonal frequency division multiplexing (OFDM), multicarrier signals can have a PAR of up to 20 dB. These signals have to be amplified fairly linearly to avoid generating ACP.

Due to the potential for high peak powers in wireless communications signals, CDMA, TDMA and frequency division multiple access (FDMA) base stations typically use radio frequency (RF) amplifiers operating in class AB mode and biased with a high current to be able to handle those peak powers. The efficiency of these amplifiers is typically less than 10%. This low efficiency leads to higher power consumption, lower overall reliability and higher operating temperatures. For low power levels, the amplifier will operate in class A operation, which has poor power added efficiency (PAE). But for the big signal peaks the amplifier will operate in class AB, which will have better PAE. A class A type amplifier is biased as a current source that conducts over a full 360° of input signal, while a class AB amplifier has a conduction angle, α, which is between 180° and 360°. The conduction angle, α, is an indication on the proportion of the RF cycle of which conduction of the transistor(s) is(are) conducting. A class A amplifier has a conduction angle of α=360° and is often operated as a small signal amplifier. In practice, it is preferred to have a class AB operation where the conduction of the transistors in the amplifier has a conduction angle less than 360°. This reduction in conduction angle translates to a bigger swing in DC supply current passed through the bias circuits, from the large energy-storing capacitors to the drain terminal of the amplifier device, for the large signal peaks (which can be as high as 12 dB higher than the rms signal power).

Because the efficiency of the amplifier is inversely related to its linearity, various linearization methods are used to enable the use of more cost-effective and more power efficient amplifiers while maintaining an acceptable level of linearity. Feed-forward correction is routinely deployed in modem amplifiers to improve the linearity of the main amplifier with various input patterns. The essence of the feed-forward correction is to isolate the distortion generated by the main amplifier on a feed forward path. The distortion is provided to a correction amplifier on the feed forward path which amplifies the distortion. The distortion on the feed forward path is combined with the distortion on the main signal path to cancel the distortion on the main signal path.

Predistortion techniques work by applying the inverse transfer characteristics of the amplifier to the signal before the signal is applied to the amplifier. The simplified mathematical explanation of the predistortion concept can be expressed as:

$$s(t) \cdot h(s) \cdot y(s) = s(t),$$

where s(t) is the time domain signal, h(s) is the amplifier transfer characteristics curve and y(s) is the inverse of the amplifier characteristics curve y(s)=1/h(s). The predistortion is important when the amplifier operates in the more non-linear region class AB, whereas the amplifier's FET's are biased for class A operation for small signals. When the amplifier operates in class AB, which is for large peaks close to maximum power of the amplifier, the current (at the drain terminal) will be pulsing with frequency components up to the envelope bandwidth. The drain current Ids will be "switched" on-off at a frequency equal to the signal envelope. The maximum current-frequency will be limited by the envelope frequency or bandwidth of the input signal at the gate of the FET device. In practice, the predistortion added to the signal widens the bandwidth or envelope of the input signal to the amplifier, for example creating a bandwidth expansion factor of 2.5 to 3. The wideband linearity of the predistortion amplifier depends on the ability to model the non-linearity of the amplifier. This is hampered if dynamic peak clipping occurs. Dynamic peak clipping occurs when a voltage drop across the DC bias network occurs when the amplifier draws large currents at the signal peaks and hence maximum available power is reduced below the expected available power.

Today, the gate and drain bias networks for the amplifier use a ladder-type of bias circuit. A ladder-type of bias circuit has a series-parallel-series parallel structure with any combination of resistors, capacitors and inductors. FIG. 1 shows a ladder tupe bias circuit 20 with series inductors 22a and 22b, parallel capacitors 24a–c and a parallel inductor 26. Traditionally, the bias networks of an amplifier have been designed to be as narrow as possible to filter out any signals beyond a few hundred kilohertz or a few megahertz to prevent those signals, including the RF or signal envelope (baseband) signals, from going into the DC bias networks. Many times a series device in the DC bias networks helps to narrow the bias circuit filter. However, a series device, such as an inductor or ferrite bead, on the DC bias network can have a significant impedance at baseband frequency (or the envelope frequency or bandwidth of the input signal). As such, there will be a voltage drop across that element as a function of the current. This voltage drop can harm the amplifier in two ways:

1) the series voltage drop will causes the amplifier to have less supply bias voltage $V_{dd}$, hence the saturated output power level P1 dB will decrease which will cause increased harmonic and intermodulation distortion (IMD); and 2) the series voltage drop will become a voltage signal (compared to the current pulsing at envelope frequencies) resulting in the drain voltage being modulated and mixing with the RF input signal, hence creating higher IMDs.

Additionally, in multiple stage amplifier configurations having a driver stage and an amplification stage, the DC bias networks for the driver stage amplifier and the amplification stage amplifier needs to be isolated from frequencies within the input signal baseband or envelope frequencies. FIG. 2a shows a multiple stage amplifier 28 having first and second stages 29a and b with corresponding DC bias networks 30a and 30b for each stage. If a series voltage drop is to occur at either or both bias networks 30a or b, leakage of the low frequency signals, for example up to a few hundred kilohertz or a few Megahertz, within the envelope frequency can be coupled in between the stages, leading to higher IMDs. In a multiple amplifier configuration using a common power bus, these signals could adversely effect other amplifiers. FIG. 2b shows the bias networks 30a and 30b used with a parallel stage amplifier 31.

Narrow bias network designs have worked fine with the use of narrowband signals, such as AMPS, TDMA/IS-136, and GSM signals, where the modulation envelope frequency is low. As the wideband radio concept has caught on, the traditional feed-forward amplifier, with its extended and somewhat costly circuitry to handle the cancellation of the inter-modulation distortion (IMD), has not had any problems with wider bandwidth signals, as long as the correction loop amplifier circuitry could handle the bandwidth.

However, as the bandwidth of signals gets wider and the use of bandwidth widening predistortion techniques are used, impedence variations of the DC bias network across the input signal envelope frequency band lead to voltage drops within the input signal envelope frequency band in current bias network structures. Such voltage drops lead to dynamic peak clipping where amplifier draws large currents at the signal peaks and hence maximum available power is reduced below the expected available power, thereby degrading the wideband linearity of the amplifier.

FIG. 3 shows the real and imaginary impedances of a bias network from the drain terminal of an LDMOS amplifier with the short-circuiting of the power input to the bias network. As shown, the real impedance curve 32 and the imaginary impedance curve 33 both show a rise and fall in the impedance of the bias network across the input signal envelope frequency band. For example, the real impedance reaches a peak 34 at about 600 KHz while the imaginary impedance crosses from a positive to negative value, a classical example of a tuned-resonant circuit. This resonance within the input signal envelope frequency cause voltage variations across the bias network at such resonant frequencies. Such voltage variations degrades the amplifier performance and reduces the effectiveness of predistortion linearization techniques because the power supplied by the bias network to the amplifier changes with the changing input signal, thereby changing the characteristics of the amplifier being predistorted and leading to nonlinear components being introduced into the amplifier output.

SUMMARY OF THE INVENTION

The present invention is an amplifier bias system and method having only reduced resonances at least throughout the envelope frequency of the signal to be amplified. Thus, the amplifier bias system can provide bias current to the amplifier with minimal voltage variations over the envelope frequency band, especially during signal peaks. For example, the amplifier bias system can be used as an amplifier gate or drain bias network where the amplifier bias system is coupled between the power supply and the gate or drain terminals of the amplifier. The amplifier bias system can include an amplifier bias filter having an impedance which is relatively low at least throughout the envelope frequency of the input signal and relatively high at radio frequency. Because the amplifier bias filter has an impedance which is relatively low through at least the envelope or baseband frequency of the input signal and relatively high at radio frequency (RF), the voltage will be relatively constant due to the low voltage drops over the bias network from energy within the envelope frequency band. To reduce the propagation of frequency components within the envelope frequency through the amplifier bias system, an energy handling device can filter energy within the envelope frequency, for example by acting as a short to ground for certain frequencies within the envelope frequency. For signal peaks within the envelope frequency, the energy handling device can provide current through the amplifier bias filter to the amplifier. In certain embodiments, the amplifier bias filter is an admittance filter including parallel elements with no series elements, and the energy storage device is a large capacitor connected in parallel with the parallel elements of the admittance filter between the admittance filter and the power supply.

BRIEF DESCRIPTION OF THE DRAWINGS

Other aspects and advantages of the present invention may become apparent upon reading the following detailed description and upon reference to the drawings in which:

FIG. 3 shows a graph of impedance curves for a typical amplifier bias network;

FIGS. 5a and 5b show transfer characteristics for an embodiment of the amplifier bias system according to principles of the present invention;

FIG. 6 shows an embodiment of an amplifier bias system according to principles of the present invention;

DETAILED DESCRIPTION

An illustrative embodiment of an amplifier bias system and method with reduced resonances according to principles of the present invention is described below. Reduced resonance can refer to a localized (within the envelope frequency of the input signal) increase then decrease ("bump") or localized decrease then increase ("dip") of a certain magnitude across frequency in the impedance, voltage and/or power of the amplifier bias system. In certain embodiments, the impedance and/or voltage across the amplifier bias system is substantially constant, linear and/or substantially smooth across the envelope frequency of the input signal. For example, reduced resonances can be shown when the bumps or dips in the voltage curve represent less than 5% of the supply voltage. Reduced resonances can also occur if the slope of the characteristic (impedance, voltage or power) curve maintains the sign of its slope throughout the input signal envelope frequency. Reduced resonances can also be reflected by a monotonically increasing or decreasing impedance curve across the input signal envelope frequency. Reduced resonances can also be shown in amplifiers that pass the tests described below.

Figure 1:
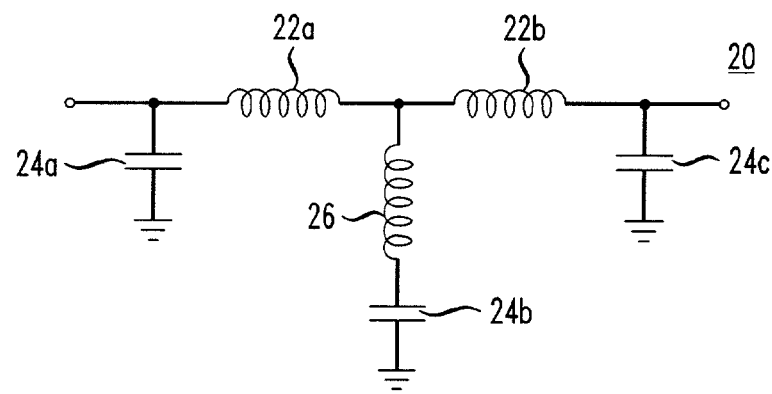
FIG. 1 shows a ladder-type filter configuration used in amplifier bias networks.
Figure 2A:
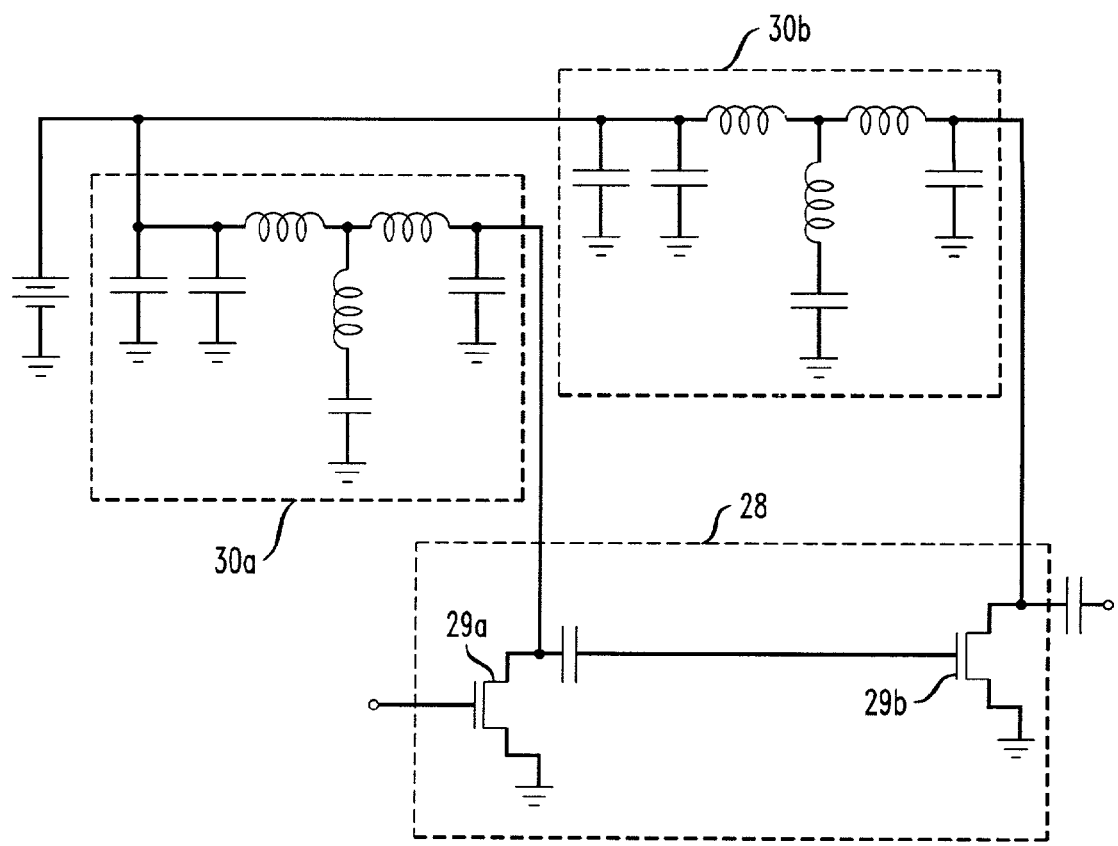
FIG. 2a shows a multiple level bias system or network with a multiple stage amplifier.
Figure 2B:
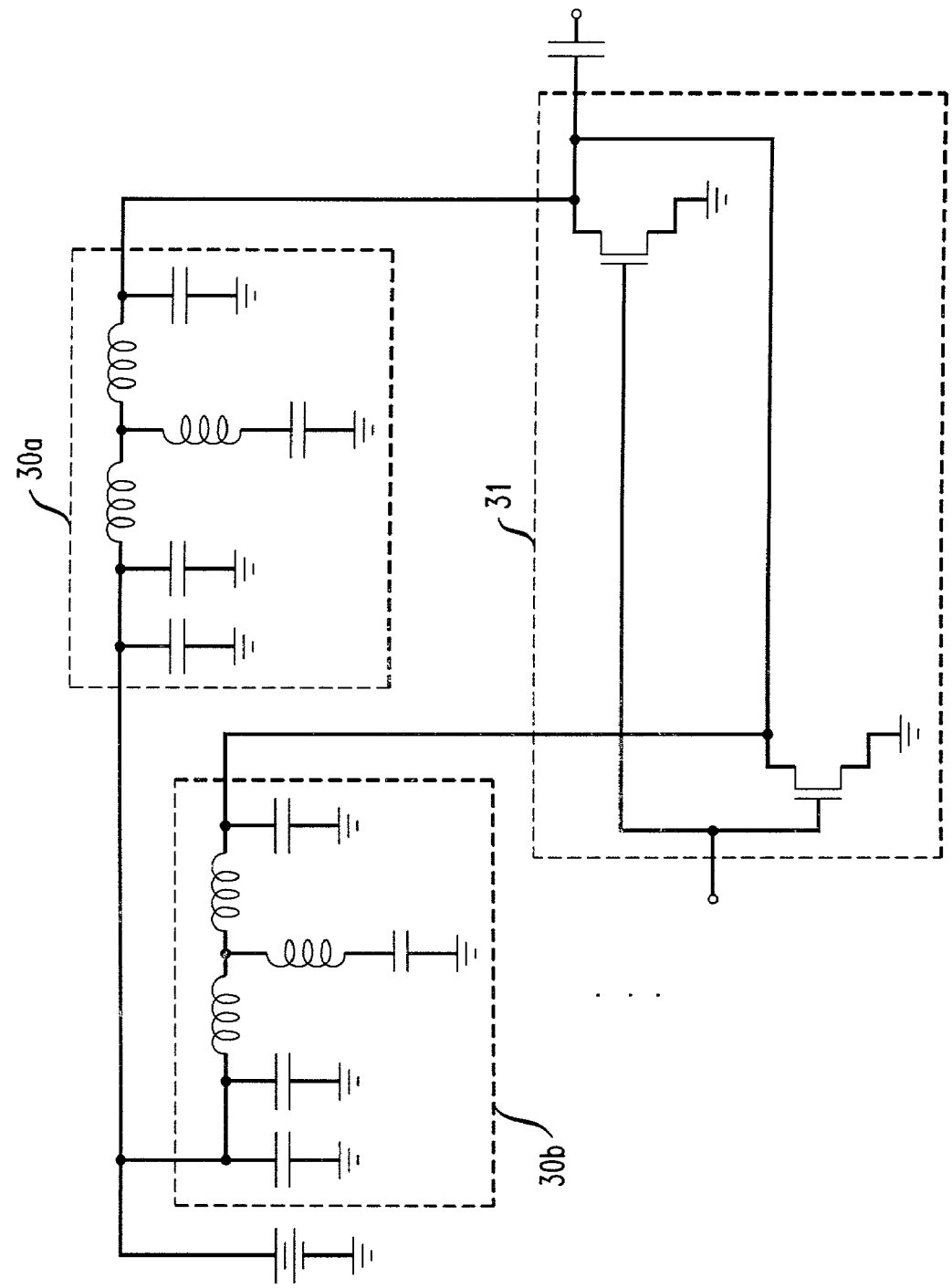
FIG. 2b shows a multiple level bias network with a parallel stage amplifier.
Figure 4:
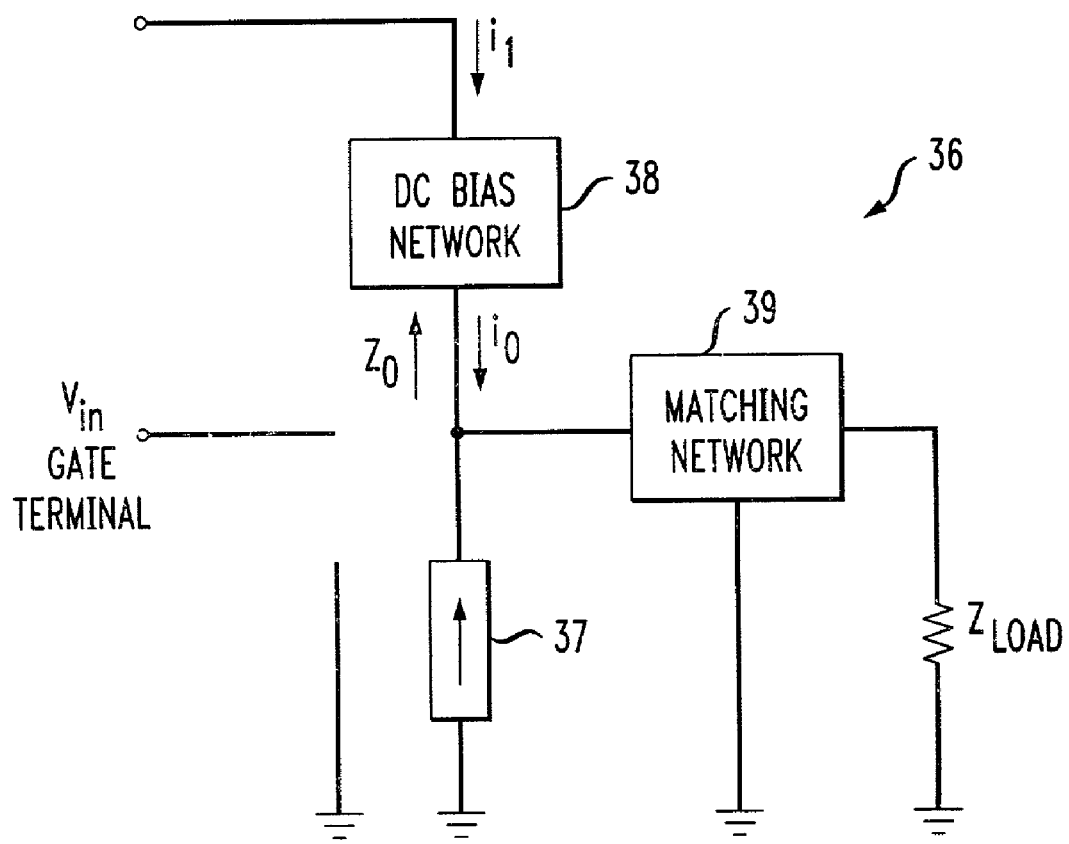
FIG. 4 shows a block diagram of a typical FET amplifier with a DC bias network.

FIG. 4 shows a general block diagram for a FET amplifier 36 having a load $Z_{load}$. The amplifier 36 includes a gate terminal Vin, a current source 37, a DC bias network 38 and a matching network 39 at the output. The RE output matching network 39 achieves desired tradeoffs between spectral linearity, efficiency, power transfer and bandwidth and also keeps the modulation or envelope frequency of the input signal from propagating through to the RF output.

FIGS. 5a and 5b show the transfer characteristics for an embodiment according to the principles of the present invention of the amplifier bias network 38 of FIG. 4. As shown in FIG. 5a within a first few KHz, the current $i_i$ going into bias network 38 relative to the current $i_0$ being supplied for amplifying the input signal is unity. After the first few KHz, the level of the input current $i_i$ is small, and a energy handling device, such as a temporary energy storage capacitor, supplies the current needed for the signal peaks. As such, in this embodiment, after the first few KHz, the current into the bias network is relatively low while the current provided by the bias network is relatively high, and the ratio is maintained relatively constant through the bandwidth of the input signal envelope frequency and through the frequency band of operation at RF. The DC bias system 38 needs an energy storage capacity large enough to handle the current needed for the duration of signal peaks, while still fast enough to respond to the bandwidth of the input signal envelope frequency. This will result in the input signal envelope frequency or modulation envelope frequency being blocked from propagating back into the DC supply.

FIG. 5b shows the impedance $Z_0$ by frequency of this embodiment of the DC bias network 38 by frequency. In this embodiment according to the principles of the present invention, the impedance $Z_0$ is relatively constant through the baseband (if no additional modulation of the input signal) or envelope frequency (including additional bandwidth due to predistortion or other modulation of the signal prior to being amplified). In certain embodiments, the impedance $Z_0$ is relatively constant through the input signal envelope frequency which is greater than the baseband frequency because the baseband signal is predistorted or modulated in other ways. Thus, if the impedance of the bias network as well as the current through the bias network is relatively constant over the envelope frequency, the voltage drop across the DC bias network will be relatively constant through the input signal envelope frequency. As such, the amplifier will be more readily linearized using predistortion because the amplifier will tend to operate more uniformly throughout the input signal envelope frequency.

In certain embodiments, the impedance should be as close to zero as possible from DC up to the input signal envelope frequency or modulation envelope frequency and as high as possible for the RF frequencies. The input of the drain bias network can have a large storage bypass capacitor to provide to supply the instantaneous peak current when needed. The large storage capacitors will ensure that the current supplied from the DC supply at the occasional signal peaks does not get attenuated by a significant amount, hence assuring that the device cannot instantaneously pull the DC supply to a lower voltage. If the lowering of the device DC supply voltage does occur, gain compression and lower saturated power, Psat, would result, decreasing the peak-to-average power ratio handling of the device and increase the distortion (dynamic peak clipping). However, the large storage capacitor has a significant equivalent inductance which will cause a slower response to the peak current needed. This can be resolved by adding smaller bypass capacitors with smaller time constants, hence responding faster to the peak current required.

FIG. 6 shows an amplifier bias system 40 which is coupled between a power supply and a terminal of an amplifier (or to a quarter-wave microstrip coupled to the amplifier terminal), for example the gate or drain terminal of an FET amplifier. The amplifier bias system 40 includes an amplifier bias filter 42 which has an impedance which is relatively low and uniform at least throughout the envelope frequency of the input signal and relatively high at radio frequency. Because the amplifier bias filter has an impedance which is relatively low through at least the envelope or baseband frequency of the input signal and relatively high at radio frequency (RF), the voltage will be relatively constant due to the low voltage drops over the bias network from energy within the envelope frequency band. Thus, the amplifier bias filter can provide bias current to the amplifier with minimal voltage variations over the envelope frequency band during signal peaks.

In this embodiment, the amplifier bias filter 42 is an admittance filter including parallel elements 46a–c. For example, parallel element 46a includes capacitor 48; parallel element 46b includes capacitor 52; and parallel element 46c includes capacitor 54. In this embodiment, the admittance filter includes no serial elements to maintain the impedance of the admittance filter low. The filter 42 hampers any energy at frequency components greater than the envelope frequency from propagating through it. To reduce the propagation of frequency components within the envelope frequency through the amplifier bias system, an energy handling device 60 can act as a short for energy within the envelope frequency. In embodiments where the amplifier bias system 40 is connected to the gate bias voltage supply, the energy handling device 60 may not be used. The energy handling device 60 can be a large capacitor 62 which is charged by the DC line voltage, for example to 28 V and acts as a short for frequencies within the envelope frequency.

During signal peaks, which occur during the envelope frequency, the amplifier will draw current from the energy handling device 60. Because the current demand (or impedance) of the amplifier will be changing at frequencies within the envelope frequency, the energy handling device 60 in this embodiment provides current through the amplifier bias filter to the amplifier with frequency components within the envelope frequency. Since that current is flowing from the capacitor 62 to the amplifier, the frequency components within the envelope frequency do not propagate into the power distribution line 64 where a voltage signal having those frequency components could be produced. The current flowing from the capacitor 62 through the amplifier bias filter 42 does not produce voltage variations across the envelope frequency which could result in dynamic peak clipping due to the impedance characteristics of the amplifier bias filter across the envelope frequency.

Figure 7:
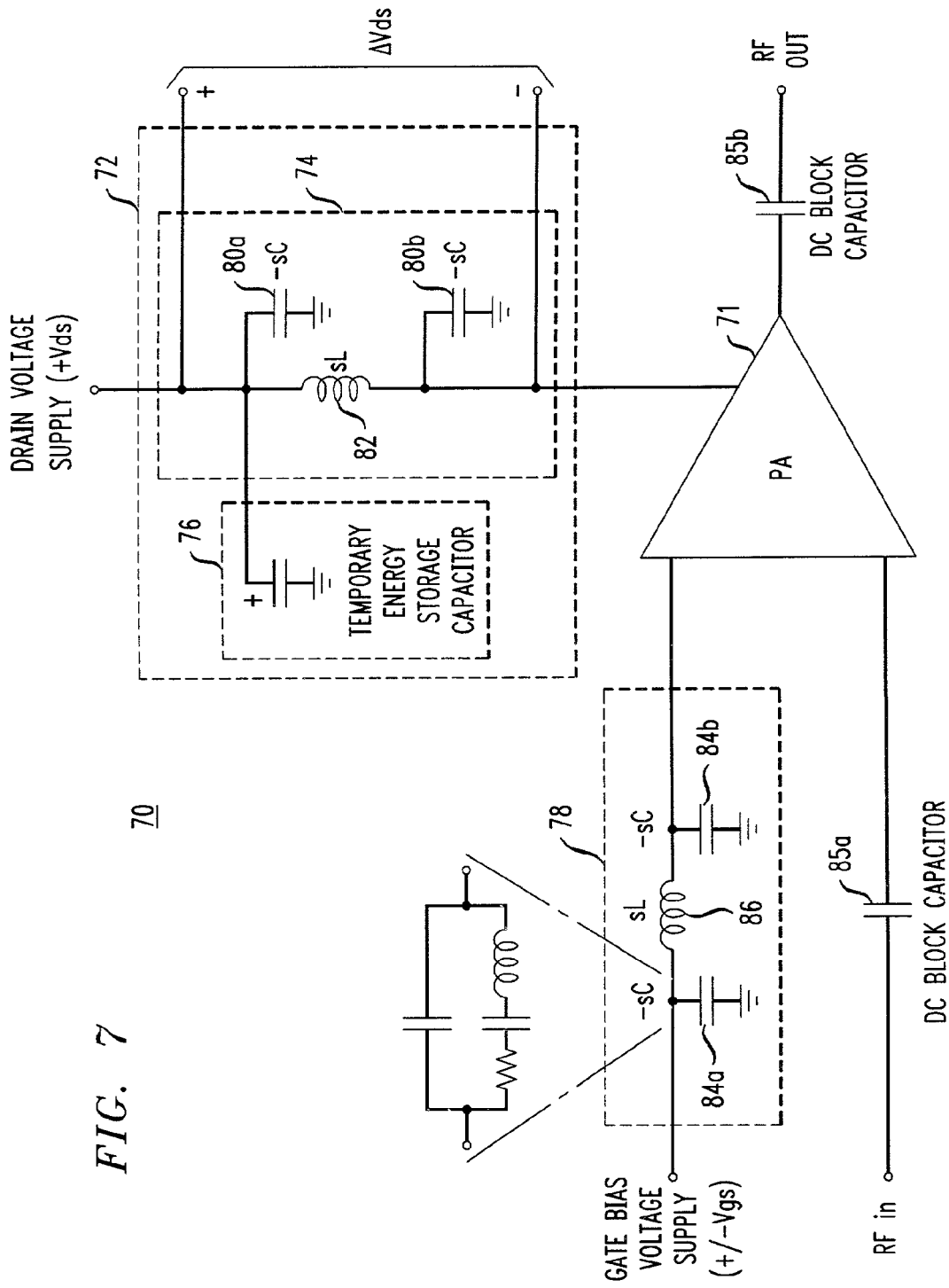
FIG. 7 shows gate supply and drain supply amplifier bias systems according to principles of the present invention used in an amplifier module.

FIG. 7 shows an amplifier module 70 for an amplifier 71 using an amplifier bias system 72 coupled to the drain bias voltage supply. In this embodiment, the amplifier bias system 72 includes an amplifier bias filter 74 and an energy handling device 76. The energy handling device 76 is a large storage capacitor. The amplifier bias filter 74 includes parallel capacitors 80*a–b*. In this embodiment, the inductance 82 is not a discrete inductor element but represents the line inductance. An amplifier bias system 78 is coupled to the gate bias voltage supply without an energy handling device. The amplifier bias system 78 is in the form of an amplifier bias filter with parallel capacitors 84*a–b* and line inductance 86. A quarter-wave microstrip (not shown) is connected between the drain terminal of the amplifier 71 and first bypass capacitor 80*b*.

In amplifier systems using digital predistortion to linearize the amplifier, little voltage drop in the drain bias system 72 can be tolerated because amplifiers using digital predistortion are designed such that the RF input signal peaks are run somewhat into compression (close to the amplifier's $P_{3db}$ compression point) for better DC to RF conversion efficiency. The voltage drops are not tolerated because a drop $\Delta V_{ds}$ in the drain voltage $V_{ds}$ lowers the power level at which the amplifier saturates and thereby compresses the RF input signal. Additionally, the voltage drop in the amplifier bias system 72 translates into an analog signal with an amplitude that can directly and/or indirectly distort the input signal. Minimizing the propagation of the lower frequency envelope frequencies is important when using multistage amplifier stages, since the leakage could result in successive stages being gate modulated by the low frequency modulation envelope frequency from the preceding amplifier stage.

Figure 8A:
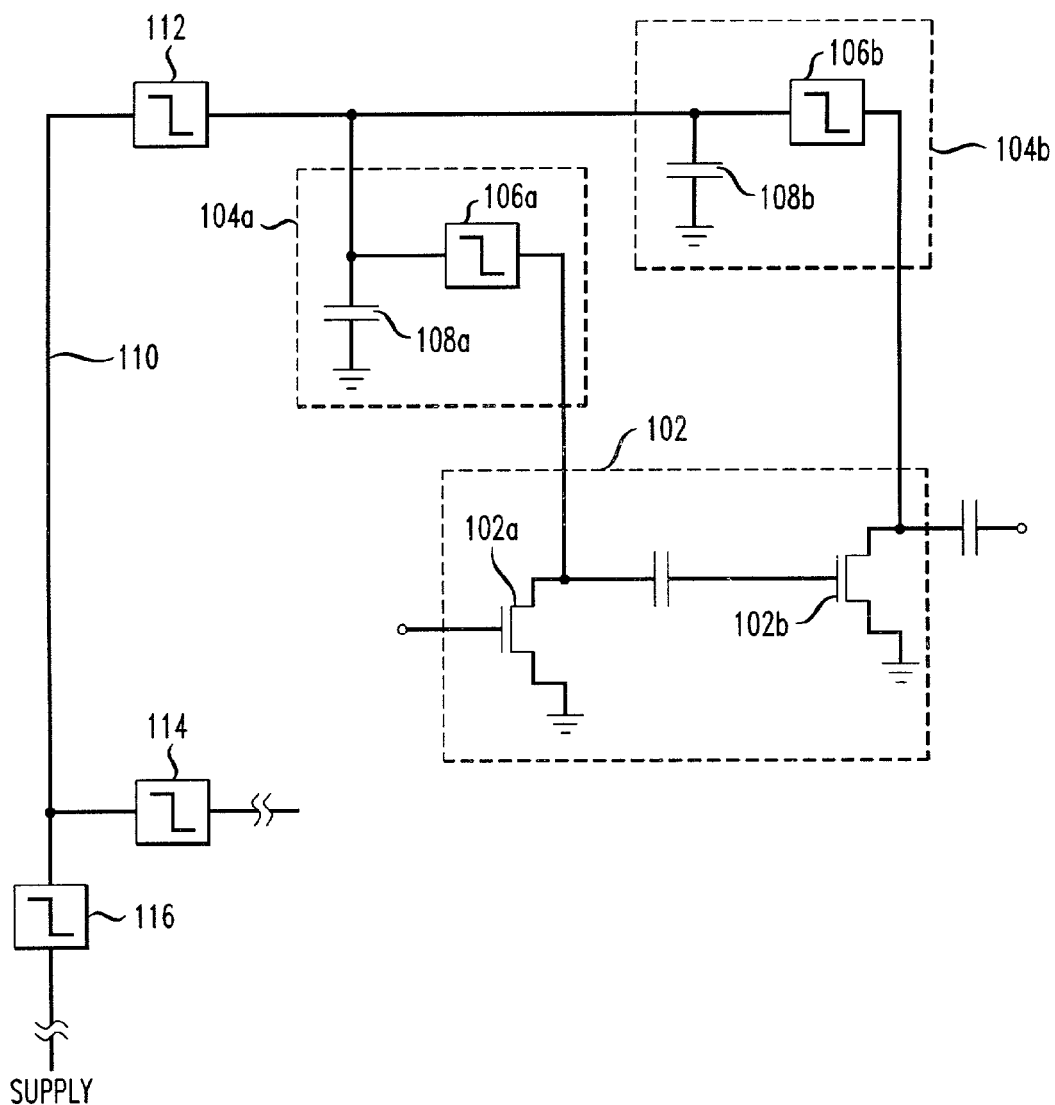
FIG. 8a shows a multiple level amplifier bias system according to principles of the present invention to be used with multiple stage amplifiers.

FIG. 8*a* shows a multilevel amplifier bias system 100 for multiple stage amplifiers 102, and in this embodiment, each multiple stage amplifier 102 is composed of amplifier stages 102*a–b* with corresponding amplifier bias systems 104*a–b*. In this embodiment, each amplifier bias system 104*a–b* has an amplifier bias filter 106*a–b* and a storage capacitor 108*a–b*. Each amplifier bias system 104*a–b* tends to prevent the propagation of frequencies within the input signal envelope frequencies between the amplifier stages 102*a–b*, especially during signal peaks when the peak current is being drawn from the capacitors 108*a–b*. In this embodiment, the capacitors of the amplifier bias system 104*a–b* smooth the peak frequency towards average power, thereby creating a lower frequency average power frequency of the amplifier 102 with multiple stages 102*a–b*. To prevent the average power frequency for the amplifier 102 from propagating onto the supply network 110, the amplifier bias system provides protection against the propagation of frequencies within the supply network 110 generated from the multiple stage amplifier 102. In this embodiment, a second level amplifier bias filter 112 is used to filter out those frequencies encompassing the average power frequency and above from the multiple stage amplifier 102.

Figure 8B:
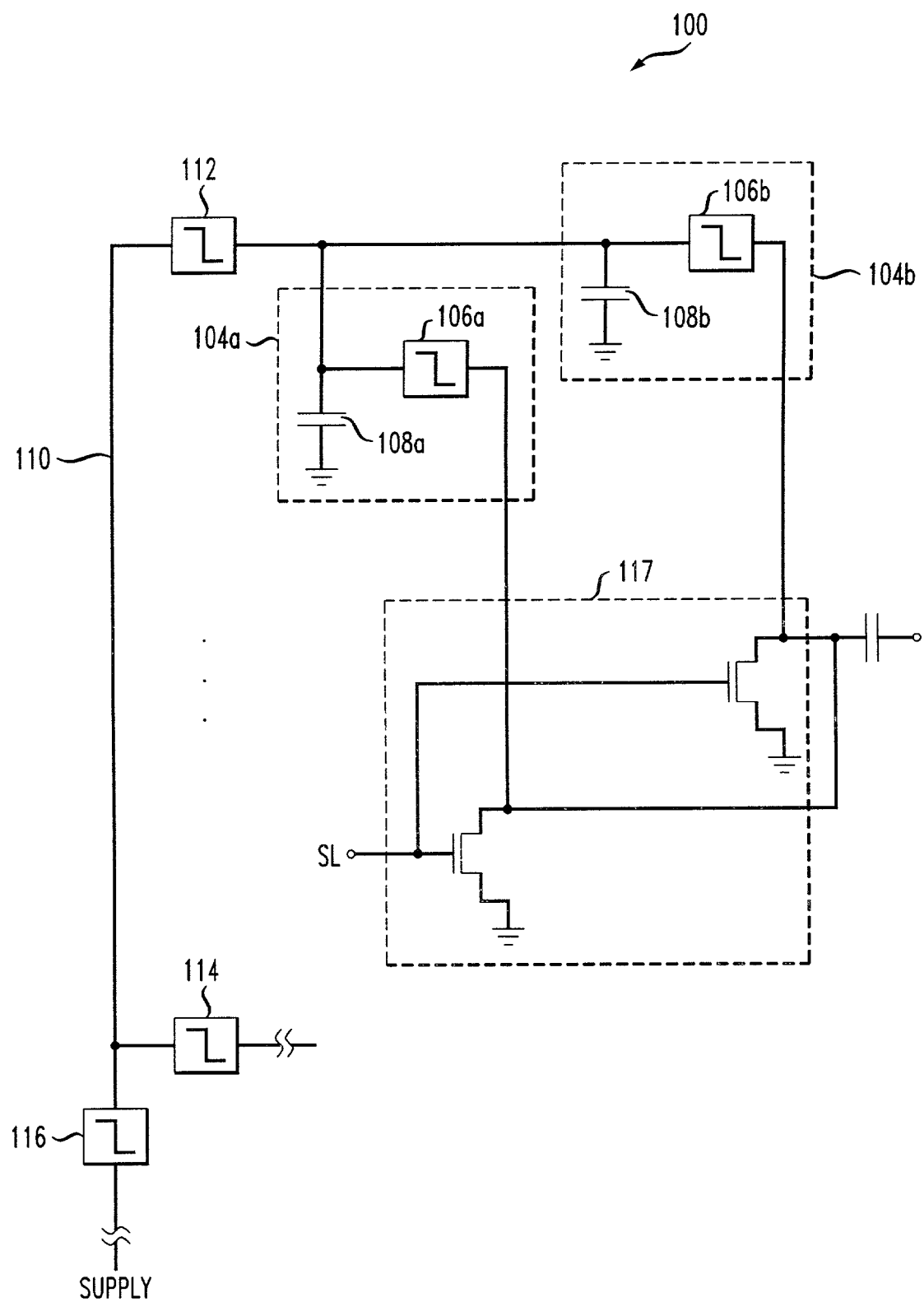
FIG. 8b shows the multiple level bias system used with parallel stage amplifiers.
Figure 9:
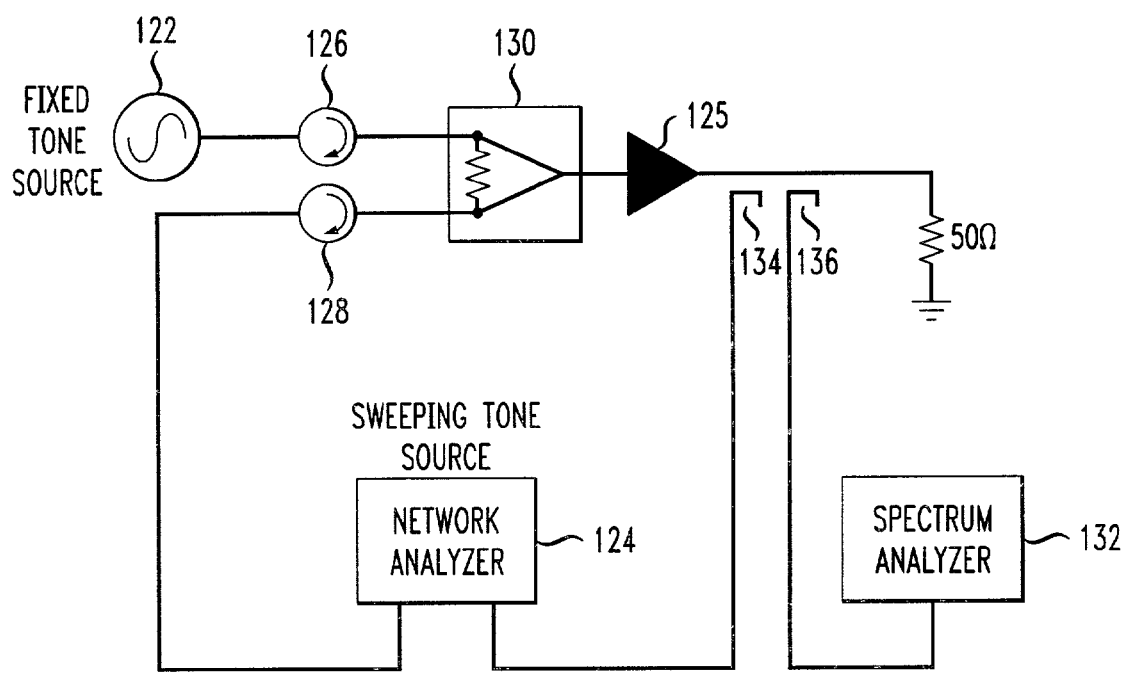
FIG. 9 shows a two tone test setup for testing amplifier modules using principles of the present invention.

Multiple multistage amplifiers can be fed by a common supply network. In such a case, corresponding second level average power filters 114 can be used to filter out the average power frequencies of their corresponding multiple stage amplifier. Since the typical second level average power filter 112 will include capacitor(s) and act to smooth the power fluctuations of the multiple stage amplifier 102, even lower average power frequencies can be generated which could propagate back through the supply network towards the power supply. Accordingly, where multiple multistage amplifiers are fed by a common bias supply, a third level average power filter 116 can be used to filter out the average frequency of the average power frequencies. If M number of multiple multistage amplifiers are fed by a common supply, M third level average power filters could be used, and a fourth level average power filter added. Furthermore, if N number of multiple, multiple multistage amplifiers are fed by a common supply, then N fourth level average power bias filters can be added, and a fifth level average power filter added to filter the lower frequency power fluctuations generated from the fourth level filters. This type of bias network architecture could continue for any number of levels. Additionally, as shown in FIG. 8*b*, this bias architecture can be used with parallel stage amplifiers 117.

As mentioned above, voltage variations generated through the amplifier bias system within the input signal envelope frequency can adversely effect on amplifier performance, especially an amplifier relying on predistorting the input signal. The distortion of the input signal prior to amplification increases the bandwidth and thereby the envelope frequency of the input signal. With the increase in envelope frequency or bandwidth, there is more frequencies which could encompass a resonant frequency of the amplifier bias networks, and these resonant frequencies lead to the voltage variations in the supply and can mix with the input signal to increase distortion. Accordingly, a method of testing how an amplifier will perform, especially in a system using digital predistortion, can examine the impedance or voltage variations across the input signal envelope frequency.

In certain embodiments, to test the amplifier's ability to handle signals with finite bandwidth, a swept two-tone frequency measurement is used. The spacing of the two tones will simulate the finite bandwidth of the input signal to be amplified. In addition, due to the class AB operation of the amplifier, the two sinusoidal tones will also cause an envelope frequency to be created in the bias network (the beat frequency of the two CW tones) if a finite bias network impedance exists. With particular reference to FIG. 7, the envelope frequency (also called baseband or beat frequency) creation is the result of current from the energy storage capacitor 76 and finite impedance of the bias filter 74. Since the amplifier is biased class AB for improved power added efficiency (PAE), the current needed from the drain bias source will vary with the signal peaks. The definition of the classes of an amplifier is that of the conduction angle (i.e. how much of a 360 degree cycle) of which the FETs are conducting. In class A, the amplifier (FETs) has a conduction angle of 360 degrees of an RF cycle, hence no variation in current drawn for larger signal peaks. However, since class AB has a conduction angle between 180 and 360 degrees, the drain current needed for the FETs will vary depending on the signal level.

Any finite impedance between the drain terminal of the amplifier 71 (in this embodiment the drain terminal of the FET) and the temporary storage capacitor 76 in the bias network 72 will translate the current drawn (as needed for the larger signal peaks in a class AB amplifier) into a voltage signal. Since the current drawn will be larger for the signal peaks, which occur on a envelope, or baseband basis, the voltage signal created in the drain amplifier bias system 72, due to finite impedance, will simply be limited by the signal bandwidth, or signal envelope. Hence, by varying the tone spacing in a two-tone CW test, the bias network's frequency response for frequencies in the baseband range can be tested.

If there is a frequency dependence in the bias network 72, the available drain voltage for the FETs will drop for those particular two-tone spacings, and the maximum available power, $P_{sat}$, will decrease as a result. Since $P_{sat}$ will decrease, the third order inter-modulation products, $IMD_3$, will increase by a factor of 3 times the decrease in $P_{sat}$. This increase in $IMD_3$ can be measured by a spectrum analyzer in max hold setting sweeping the $IMD_3$ frequency range.

To minimize the interaction on the amplifier's performance, the DC blocking capacitors 85*a*–*b* and the high-frequency bypass capacitors 80*b* and 84*b* can have their series resonance frequency occurring at the RF frequency of operation. It is also desired not to have the inductance of the line between the large temporary energy storage capacitor 76 and drain terminal of the amplifier 71 form a resonant LC circuit for any frequencies within the envelope, or bandwidth, of the signal (to be amplified). If the signal has a bandwidth of 10 MHz, it is desirable for the equivalent inductance of the line not to form a resonance between DC and 10 MHz with any combination of the bypass capacitors used as well as with the large energy storage capacitor. In addition, it is desirable for the medium-sized bypass capacitors 80*a* and 84*a* (0.01 to 1 µF ceramic surface mount capacitors) to not have any self-resonances (the combination of internal parasitics and the main capacitance of the components itself) occurring within the envelope frequency of the signal.

Figure 10:
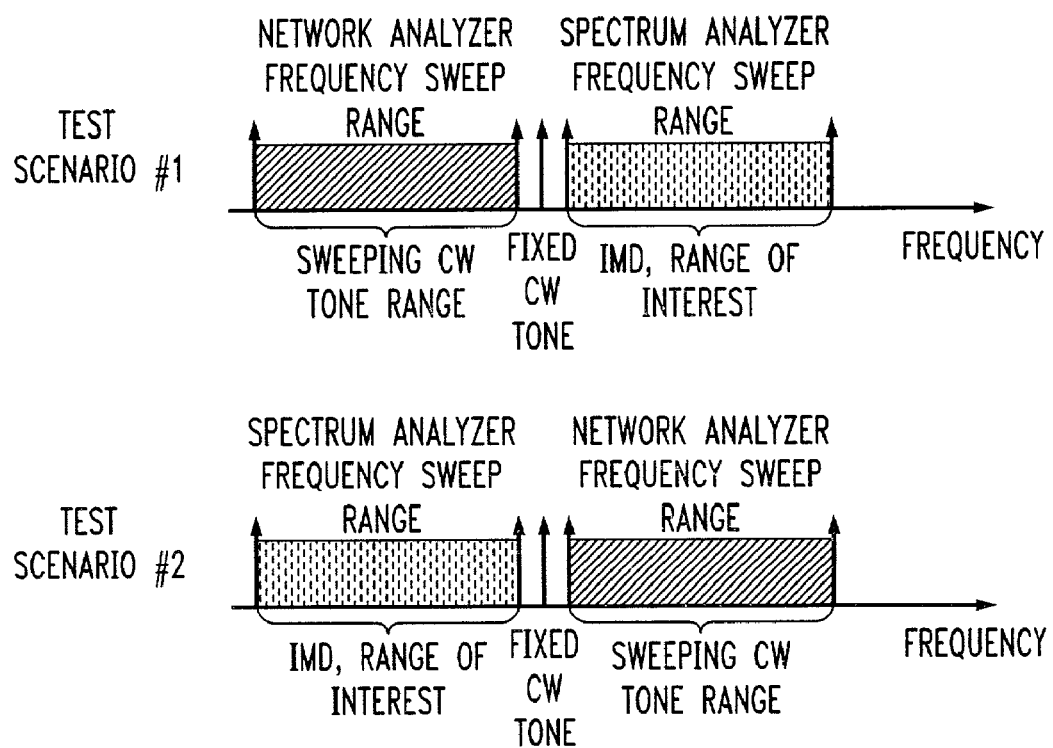
FIG. 10 shows two test scenarios for the two tone test setup of FIG. 10.

FIG. 10 shows an embodiment 120 of a test setup where there are two CW tone sources. In this embodiment, the fixed CW tone source 122 stays constant for both frequency and amplitude at all times during the particular test. The variable, or sweeping, CW tone source is generated by a network analyzer 124. The frequency span of the network analyzer 124 will correspond to the bandwidth of the amplifier 125. The circulators 126 and 128 shown at the input of the power combiner 130 are used in order to isolate the two CW sources. In this embodiment, both the network analyzer 124 and a spectrum analyzer 132 are connected to the amplifier output via either 30 dB or 40 dB couplers 134 and 136, respectively. By using couplers at the amplifier output, the power readings will be less sensitive to power load changes due to heating.

In this embodiment, the tone power level is be chosen such that it is 3 dB below the maximum allowable average power handling capability of the amplifier tested. If the power amplifier can handle 20 W average power (43 dBm), then each CW tone can have an average power of 10 W (or 40 dBm). The envelope peak-to-average power ratio (PAR) of the two CW tones is 3 dB, and should not affect the power amplifier thermally, since it is the average power that generates the heat.

In addition, the sweeping CW tone power level can be within a certain power window during the frequency sweep. This power variation will be due to the accuracy of the network analyzer 124 as well as frequency calibration issues. The power level of the sweeping tone can be within ±0.3 dB of the fixed CW tone power level during the frequency sweep. As an example, if the fixed tone is 14 W average power (41.46 dBm), then the sweeping tone can be within (41.46−0.3) dBm and (41.46+0.3) dBm (13 W to 15 W range).

If the total average power of the two tones are chosen to be too high (i.e. well above the amplifier's maximum average power handling capability), then the average drain current flowing will be higher than designed for, which results in less percentage of the peak current supplied from the energy storage capacitor vs. the current coming from the power supply.

If the total average power of the two tones is chosen to be too low (too much back-off from maximum average power handling capability), then the effects of drain bias network resonances will be reduced by the insignificant peak current flowing between the energy storage caps in the drain bias network and the power FETs.

The fixed CW tone frequency can be placed in the middle of the frequency band (for North American PCS this would be 1960 MHz). The swept CW tone can be placed either 100 kHz above or 100 kHz below the fixed CW tone in frequency. The variable CW tone can then be swept from the 100 kHz offset and to the lower or upper frequency limit of the frequency band for 1601 frequency points.

Figure 11:
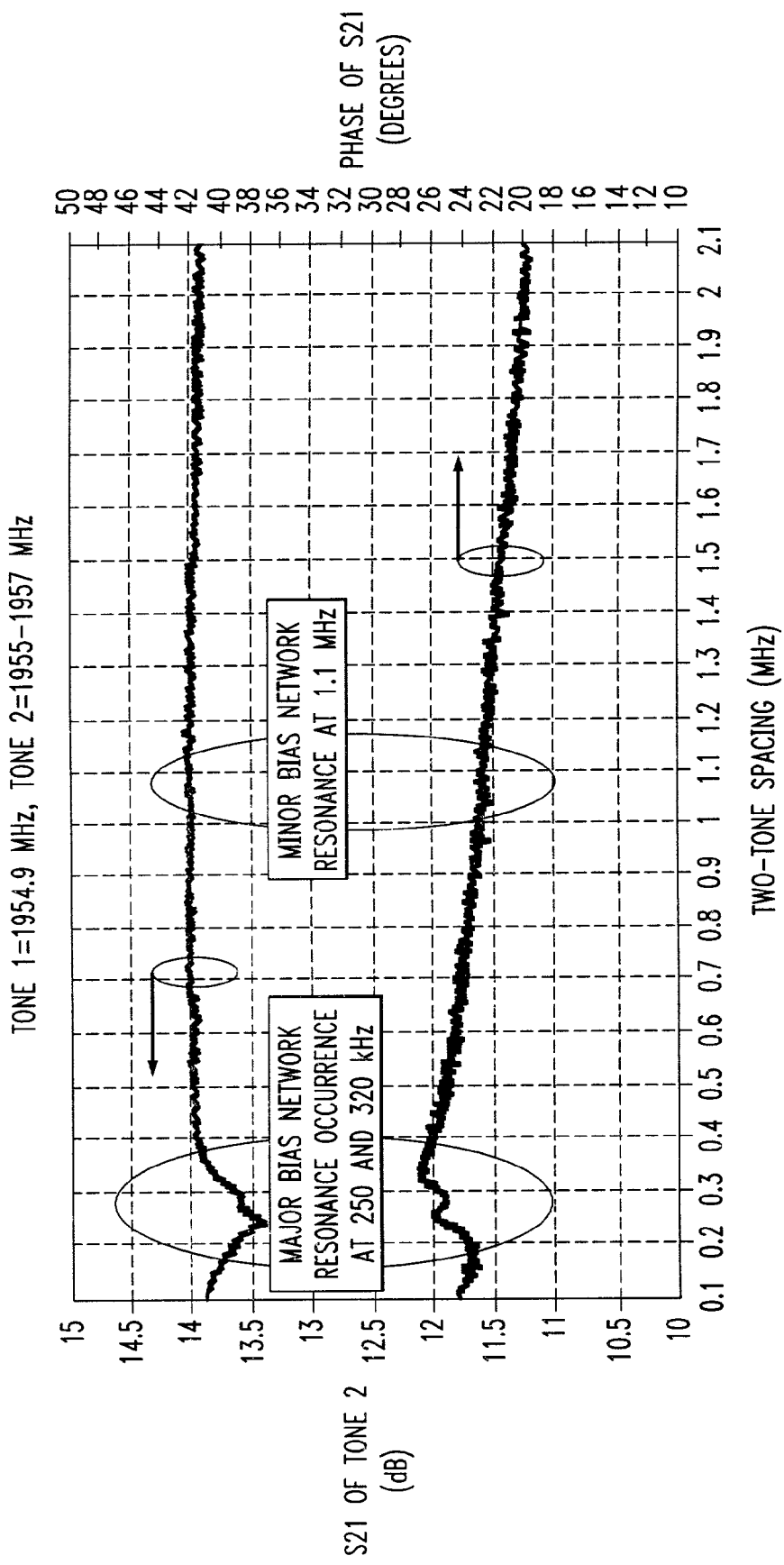
FIG. 11 shows the two tone gain response for an amplifier.

The spectrum analyzer 132 can have an equivalent span of its frequency sweep. However, instead of tuning to the variable CW tone sweep frequency range, the spectrum analyzer will sweep, in max hold mode, the $IMD_3$ frequency range. As seen in FIG. 11, there are at least two test scenarios that can be performed. The IF bandwidth setting of the network analyzer 124 can be set to 30 Hz in order to slow down the frequency sweep speed so that the spectrum analyzer in max hold setting mode can capture the third order inter-modulation product in a proper continuous line.

The frequency of the fixed CW tone is at the center of the frequency band (for PCS it would be 1960 MHz) and for test scenario 1 the variable CW tone will be swept from the lower edge of the band (1930 MHz for PCS) to 100 kHz below the fixed CW frequency (1959.9 MHz). The spectrum analyzer 132 will span from 100 kHz above the fixed CW frequency (1960.1 MHz) to the upper edge of the frequency band (1990 MHz). In test scenario 2, the variable CW tone frequency range will be from 100 kHz above the fixed CW frequency (1960.1 MHz) to the upper band edge (1990 MHz). And in contrast, the spectrum analyzer 132 will span from the lower band edge (1930 MHz) to 100 kHz below the fixed CW frequency (1959.9 MHz).

A second sweep range test can also be performed with 2 MHz frequency span in order to zoom in on low envelope frequency response that might be obscured in the wider range test. The purpose of this test is to get a better detail on the low envelope frequency response of the bias network. Again, a 1601 point network analyzer sweep with 30 Hz IF bandwidth setting can be used. Power levels for this narrowband frequency sweep are as explained in the test above.

If resonances in the bias network do occur for certain beat frequencies of the two CW tones, they will have an effect on both the gain and phase of the sweeping tone, as well as in the $IMD_3$ products. The network analyzer 124 will show the occurrence of the bias network resonance as a gain drop of the sweeping CW tone at the frequency where the beat frequency of the two tones used (fixed and sweeping tone) corresponds to the drain bias network's resonance. The sweeping tone gain phase, $\angle S_{21}$, will show a sudden deviation from the linear phase increase or decrease versus frequency slope. The spectrum analyzer plot will show a hump in the $IMD_3$ plot where the frequency spacing between the sweeping CW tone and the fixed CW tone corresponds to the power amplifier's drain bias network's resonance.

For example, an amplifier with a very distinct resonance occurrence in the bias network is tested. The frequency sweep range is only 2 MHz. The frequency of the fixed CW tone is 1954.9 MHz, and the sweeping tone has a frequency range from 1955 MHz to 1957 MHz. The smallest envelope frequency created is 100 kHz and the largest is 1957.0−1954.9=2.1 MHz. The power level of each of the two tones was chosen to be 3 dB below the amplifier's maximum average power capability.

Figure 12:
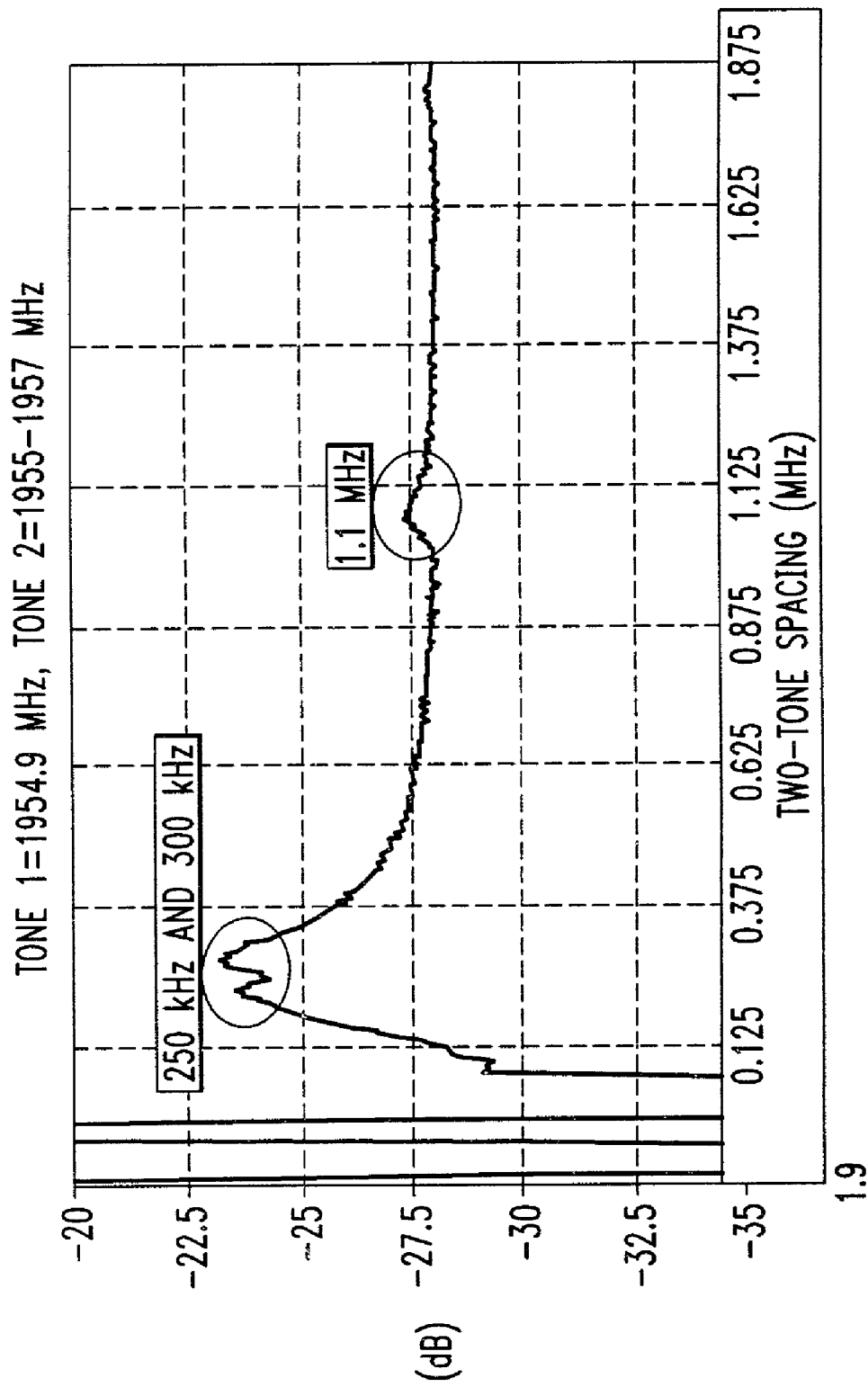
FIG. 12 shows the two tone third order IMD response for an amplifier.
Figure 13:
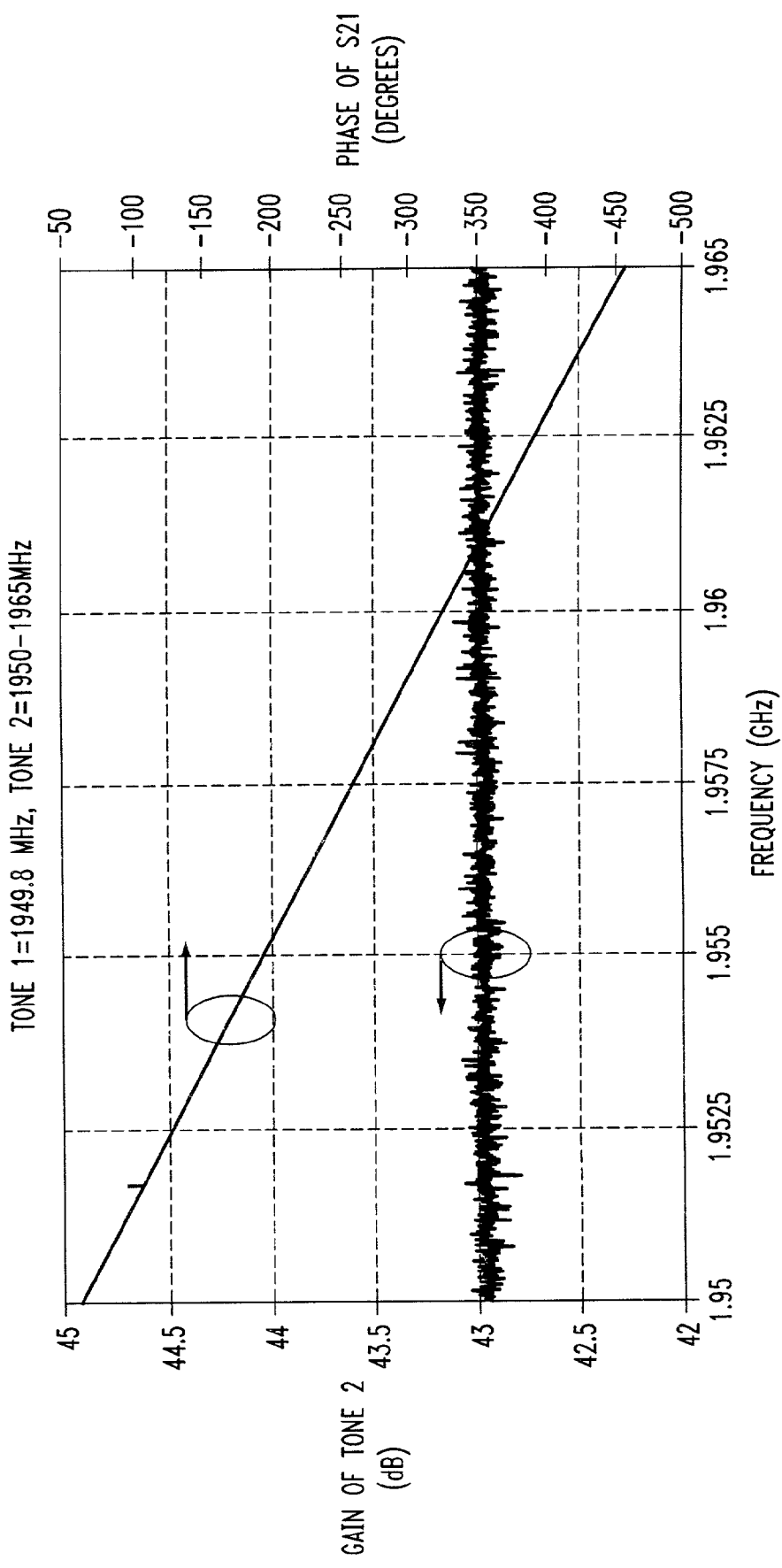
FIG. 13 shows amplifier gain of the sweeping tone in a two tone test.

As shown in FIG. 12 and FIG. 13, resonances occur at 250 kHz, 320 kHz and 1.1 MHz. However, only the resonances at 250 kHz and 320 kHz are significant enough to pose a real problem. The gain drop shown in FIG. 12 is 0.6 dB and the phase response of the gain, $\angle S_{21}$, is altered, or skewed, 5 degrees over the 250 kHz and 320 kHz region. The max hold of the third order inter-modulation product, $IMD_3$, shown in FIG. 13 also shows the resonance occurrence in the bias network. The degradation of the $IMD_3$ is 5.5 dB at the 250 kHz two-tone spacing, while at 1.1 MHz two-tone spacing the degradation is about 0.8 dB.

This amplifier is not recommended for input signals with bandwidth above 200 kHz. If a peak current required between the large temporary energy storage capacitors in the drain bias network and the drain terminal of the power FETs has a repetition frequency above the 200 kHz (envelope frequency components), then there will be a large voltage drop across the bias network due to the three distinct resonances, as indicated in FIG. 12 and FIG. 13. When this voltage drop across the drain bias network occur, the available power headroom of the amplifier is reduced, and the amplifier goes more into compression, if not saturation. This reduced available $P_{sat}$ increases the spectral regrowth (or distortion) of the amplifier output.

Figure 14:
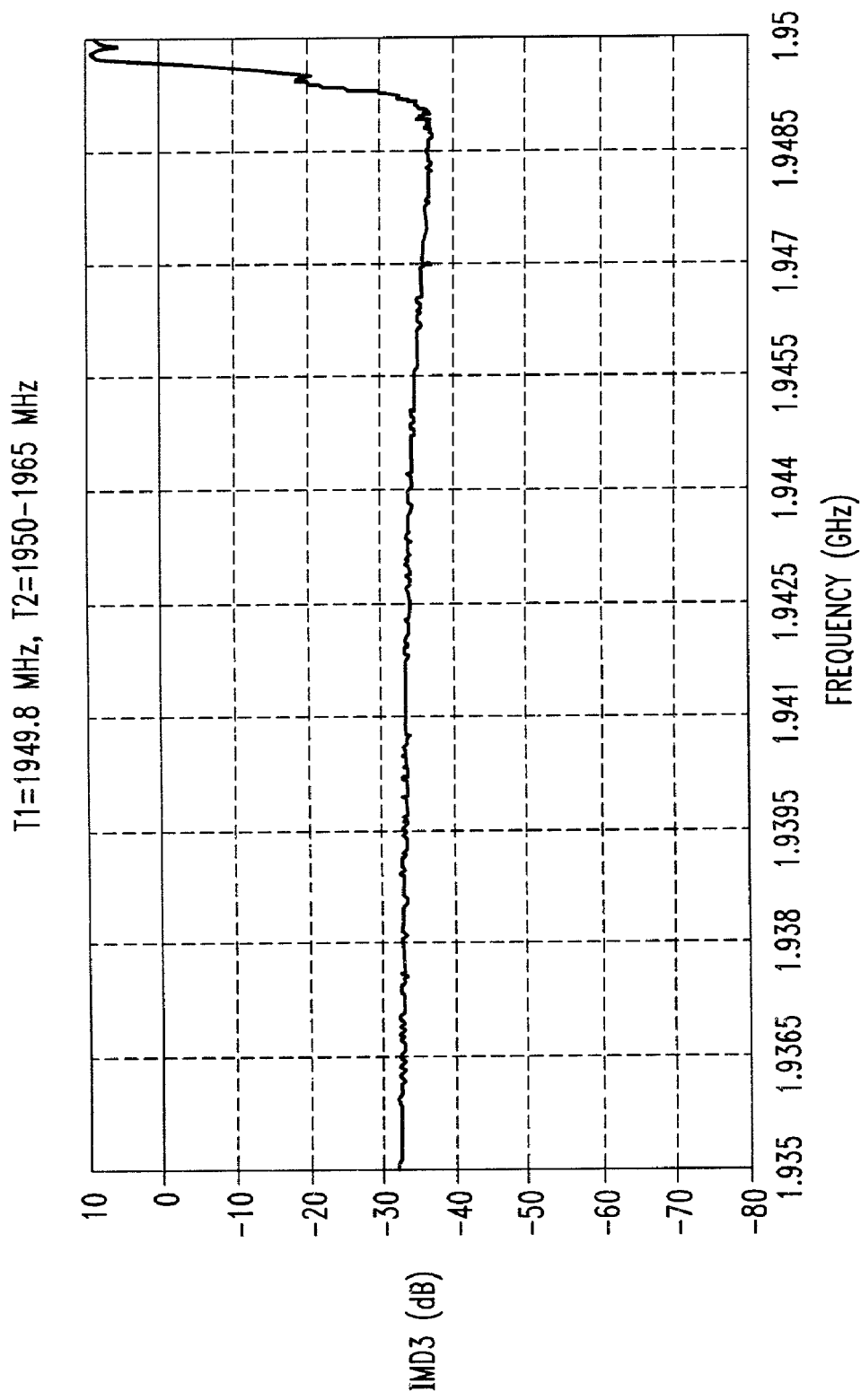
FIG. 14 shows the maximum hold of the third order IMDs created by an amplifier in a two tone test.

In another example, an amplifier with no distinct resonance occurrences in the bias network is tested. The frequency sweep range for this case is 15 MHz. No gain variation or phase distortion of the sweeping tone is present in FIG. 14. FIG. 15 shows the spectrum analyzer's max hold of the $IMD_3$ and no apparent bumps can be seen. In fact, the power amplifier's drain bias network does not seem to have any resonance occurrences in the 15 MHz envelope frequency span.

As explained above, the resonances in the bias network will be visible on both the network analyzer data and the spectrum analyzer data. The network analyzer measures the magnitude of the gain, $|S_{21}|$, and its phase, $\angle S_{21}$. If a resonance in the bias network is encountered for a particular two-tone beat frequency, the gain and phase will be perturbed at the resonance. If the gain variation is more than 0.15 dB within a 500 kHz window, and the phase of the gain is visibly skewed for more than 1 degree from a straight line within the same window, then the amplifier should not pass this two-tone test.

As a confirmation, the spectrum analyzer data, obtained from max hold sweep operation of the $IMD_3$ frequency range, should not show a degradation of the $IMD_3$ of more than 1.5 dB within the same 500 kHz window.

A resonance in the amplifier's drain bias network will show signs in both the network analyzer and the spectrum analyzer data, and if both show the signs as explained above, then the amplifier will fail the test.

In addition to the embodiment described above, alternative configurations of the amplifier bias system (and testing scheme thereof) according to the principles of the present invention are possible which omit and/or add components and/or use variations or portions of the described system. For example, the amplifier bias system or portions thereof can be implemented in or with other amplifier or electrical circuit arrangements or devices and different control schemes could be implemented to maintain the desired operation. The amplifier bias system has been described in the context of an amplifier in a predistortion system to reduce the distortion generated at the output of an amplifier, but the amplifier bias system can be used for amplifier systems which do not use predistortion. Depending on the application, predistortion circuitry can be used along with other linearization or efficiency-improving techniques as well as other modulation of the input signal to increase the envelope frequency. The amplifier bias system has been described as using a particular configuration of distinct functional blocks, but it should be understood that the predistortion system and portions thereof can be implemented in application specific integrated circuits, software-driven processing circuitry, firmware, hardware, discrete components or combination(s) or portion(s) thereof as would be understood by one of ordinary skill in the art with the benefit of this disclosure. What has been described is merely illustrative of the application of the principles of the present invention. Those skilled in the art will readily recognize that these and various other modifications, arrangements and methods can be made to the present invention without strictly following the exemplary applications illustrated and described herein and without departing from the spirit and scope of the present invention.

The invention claimed is:

1. A bias system for a device that acts upon an input signal having an envelope frequency band, the system comprising:
    an admittance filter coupled to a terminal of the device, the admittance filter comprising at least two relatively small valued capacitors connected in parallel; and
    an energy handling device coupled to a power supply, the energy handling device comprising a relatively large valued storage capacitor;
    wherein the admittance filter and the energy handling device are coupled in parallel between the terminal of the device and the power supply in such a way that energy within the envelope frequency band that would otherwise resonate in the device is instead conducted to ground, thereby leading to reduced resonances across the envelope frequency band of the input signal.

2. The system defined in claim 1 wherein a quarter-wave microstrip is connected between the terminal of the device and the admittance filter.

3. The system defined in claim 1 further comprising an impedance curve across the envelope frequency band that maintains the sign of its slope.

4. The system defined in claim 1 wherein any bumps or dips in the voltage curve of the system across the envelope frequency band represent less than 5% of the supply voltage.

5. The system defined in claim 1 wherein there are no serial elements in order to maintain the impedance of the low impedance of the admittance filter.

6. The system defined in claim 1 wherein the device comprises an ampifler having a gate terminal and a drain terminal.

7. The system defined in claim 6 wherein the admittance filter is coupled to the gate terminal or the drain terminal of the amplifier.

* * * * *